United States Patent [19]

Ouchida

[11] Patent Number: 5,744,859
[45] Date of Patent: Apr. 28, 1998

[54] SEMICONDUCTOR DEVICE

[75] Inventor: Takayuki Ouchida, Beppu, Japan

[73] Assignee: Texas Instruments Incorporated, Dallas, Tex.

[21] Appl. No.: 597,759

[22] Filed: Feb. 7, 1996

[51] Int. Cl.⁶ .................................................. H01L 23/495
[52] U.S. Cl. .......................................... 257/668; 257/786
[58] Field of Search ............................... 257/786, 668, 257/776, 780, 787; 437/203, 204, 187, 180, 235

[56] References Cited

U.S. PATENT DOCUMENTS

| | | | |
|---|---|---|---|
| 4,945,399 | 7/1990 | Brown et al. | 257/780 |
| 5,355,019 | 10/1994 | Fuchs | 257/786 |
| 5,448,114 | 9/1995 | Kondoh et al. | 257/780 |
| 5,598,030 | 1/1997 | Imai et al. | 257/668 |

*Primary Examiner*—Mahshid D. Saadat
*Assistant Examiner*—S. V. Clark
*Attorney, Agent, or Firm*—Richard L. Donaldson; William B. Kempler

[57] ABSTRACT

A semiconductor device assembled as a compact tape carrier package (TCP) for tape-automated bonding(TAB). An IC chip 3 has a connection surface provided with bump electrodes 15. A flexible base film 7, carrying leads 8 and having a device hole 21 smaller than the semiconductor chip's connection surface, faces the IC chip's connection surface across a small prescribed gap 22. Inner leads 8a, 8a' extending from base film 7 through device hole 21 are bonded to bump electrodes 15 on IC chip 3. To maintain gap 22 during inner lead bonding and resin sealing the chip's connection face or the base film 7 is provided with spacer projections 35 or 55 of the same length as gap 22. During inner lead bonding the spacer projections prevent base film 7 from deforming so as to dislocate inner leads 8a, 8a' from their corresponding bump electrodes. During sealing the spacer projections enable sealing resin 13 to easily flow through gap 22 to evenly coat the chip's face and sides.

12 Claims, 12 Drawing Sheets

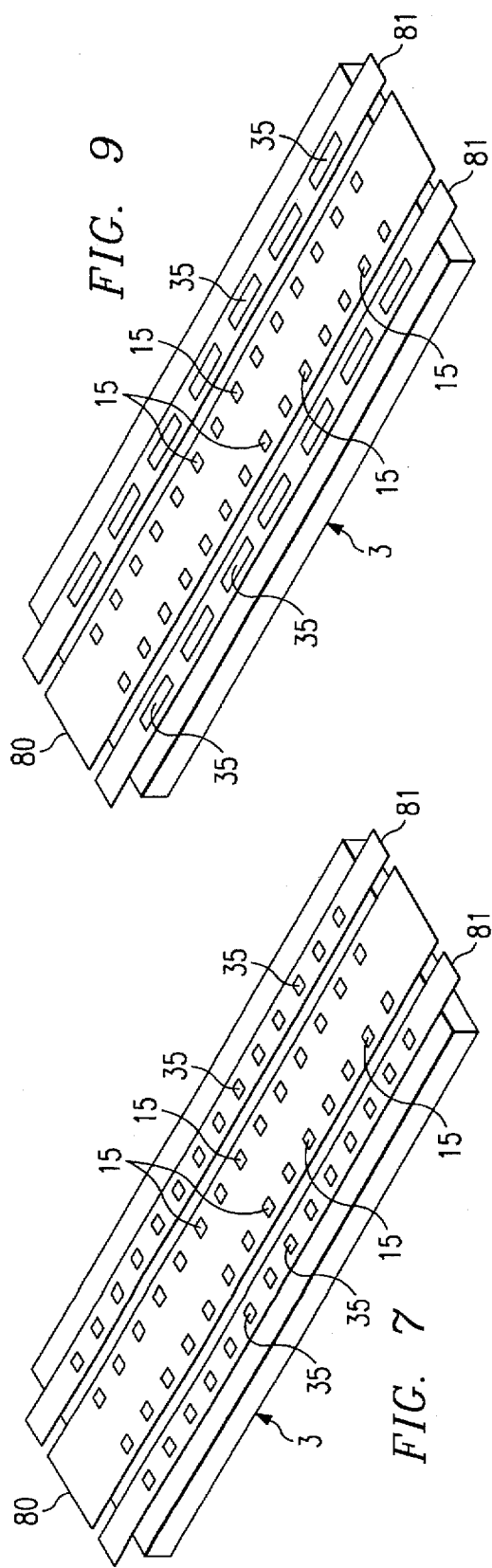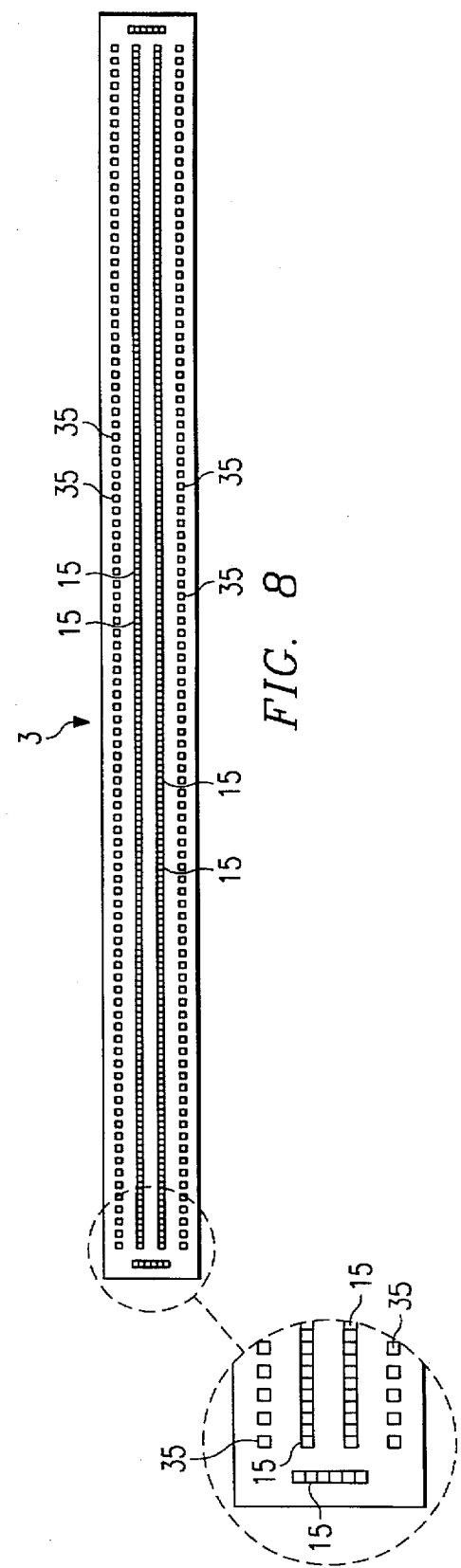

SEMICONDUCTOR DEVICE

FIELD OF THE INVENTION

The present invention relates to a semiconductor chip packaging, and more particularly to a tape carrier package (TCP) for tape-automated bonding(TAB).

BACKGROUND OF THE INVENTION

In recent years, there has been a trend toward larger semiconductor devices having a higher density of circuits that perform more diversified functions. On the other hand, users of semiconductor devices desire decreased weight and further miniaturization.

For example, the liquid-crystal displays (LCDs) used in notebook PCs must have as large a display as possible within a fixed A4 PC case size. Therefore, tape carrier packages (TCPs) are being used in LCD drivers and are often arranged on the periphery of the LCDs, making even slimmer TCPs necessary.

FIG. 20 is a cross section of a typical TCP structure for coupling an LCD driver 3 to an LCD panel substrate 10 and a printed wiring substrate 16. A lead frame 8 is formed on a polyimide base film 7. Bump electrodes 15 (bump bonding pads) formed on an semiconductor integrated circuit (IC) chip 3 (the LCD driver) are bonded to groups of inner leads 8a and 8a' of lead frame 8 by an upward-facing tape-automated bonding (TAB) method. A first group of outer leads 8b of the TCP are bonded to a conductive thin-film electrode 60 on panel substrate 10 via an anisotropic conductive film 70, and a second group of outer leads 8b are bonded (soldered) to a conductive electrode 80 on printed-wiring substrate 16.

For example as shown in FIG. 21, for a 160×3 channel LCD display 9, three IC driver chips 3 are bonded on each side at the periphery of substrate 10 to respectively connect them to matrix electrodes 11 and 12 of LCD display 9 via outer leads 8b. Then the IC chips 3 are packaged by bonding and sealing a mold resin 13 such as epoxy resin, etc., from the top. The resulting package 14 is shown in FIG. 22, in which solder resist 20 is coated on lead frame 8.

Each IC chip 3 is bonded to corresponding inner leads 8a and 8a' by corresponding upward-projecting bump electrodes 15 arranged near each side of chip 3. Of these, inner leads 8a' and outer leads 8b' conduct input signals from printed-wiring substrate 16 (not shown in FIG. 21) to IC chips 3, and inner leads 8a and outer leads 8b feed driving output signals from IC chips 3 to LCD display 9.

As shown in FIG. 22, the conventional base frame 7 for bonding the IC chips is provided with an aperture or device hole 21 larger than the corresponding IC chip 3. Although various methods have been proposed for narrowing the TCP unit containing the outer leads, such as increasing the density of the wiring pitch (lead pitch) on base film 7, minimizing the size difference between chip 3 and device hole 21, and reducing the size of chip 3, there is a limit to what these methods can achieve.

FIG. 23 shows another proposed method for narrowing TCP structure 24, in which aperture 21 is made smaller than chip 3 and a peripheral portion of chip 3 overlaps the inner edge of base film 7. In this case, the bump electrodes 15 are moved in towards the center of chip 3 by the amount by which aperture 21 is reduced.

In the TCP structure of FIG. 23, it is necessary to form a fixed gap 22 between chip 3 and base film 7 and allow the molten resin 13 to flow from the top of the chip to the sides during bonding through gap 22 to spread sealing resin 13 while maintaining a suitable distance between chip 3 and base film 7.

Processes for bonding the inner leads in the two different types of TCPs 14 and 24 will be explained with reference to corresponding FIGS. 24 and 25.

For the "large hole" geometry of FIG. 22, FIG. 24 shows an arrangement of a base film guide 33, a base film clamp 32, a bond stage 31, and a bonding tool 30 with respect to IC chip 3 and base film 7. For the "small hole" geometry of FIG. 23, FIG. 25 shows a similar arrangement with respect to IC chip 3 and base film 7, except that bonding tool 30 is narrower.

In FIGS. 24 and 25, when film 7 is maintained by film clamp 32 and film guide 33 at support point (A), bonding tool 30 applies a load to the inner lead parts at force point (B), and the peripheral edge of device hole 21 is at function point (C). The distance between points (A) and (B) may be larger in the structure of FIG. 25 than in that of FIG. 24.

At this time, the distance between points (A) and (C) also becomes large, so the displacement of point (C) becomes large according to this principle. The deformation of base film 7 near device hole 21 is greater in the structure in FIG. 25 than in FIG. 24 in response to the load applied by bonding tool 30 on inner leads 8a and 8a'.

As shown in FIG. 26, when bonding tool 30 applies pressure at force point (B) to inner leads 8a, 8a', flexible base film 7 rotates down around support point (A), being lowered by the amount of gap 22, to contact the top surface of chip 3. As the displacement is greater in FIG. 25 than in FIG. 24, the deformation of base film 7 is also greater in FIG. 25.

As shown in FIG. 27, bonding tool 30 causes each lead 8a, 8a' to rotate down, deforming until contacting an upward-projecting bump electrode 15 to which it is bonded by heat and pressure. Undesirable dislocation may occur between a bump electrode and its corresponding inner lead because deformation of the corresponding inner lead 8a, 8a' within device hole 21 occurs after base film 7 is deformed around support point (A).

Because in FIG. 27 inner leads 8a, 8a' are bonded to electrodes 15 only after base film 7 is adhered to the top surface of chip 3, there is barely a gap between the top surface of chip 3 and the lower face of base film 7. If after bonding one attempts to apply a resin seal as shown in FIG. 23 by dripping molten resin from the top, the molten resin cannot easily flow down to the sides of the chip and may not adhere to the side surfaces of the chip. Because the resin may not spread evenly to the chip ends and side surfaces, the resin seal will be incomplete. Thus, in addition to being unable to maintain mechanical strength, the device's reliability will be decreased.

FIG. 28 shows a specific pattern for a TCP lead frame 8 for the inner lead bonding process. Because there are many inner leads, during inner lead bonding great stress is applied, causing both ends of the inner leads to be greatly deformed, and things tend to be pulled toward the centers of the sides.

As shown in the enlarged plan view V1 of FIG. 29, inner leads $8a_1$ at both ends are pulled inward toward inner leads $8a_2$ at the center of the side. The large deformation causes diagonal displacement which changes the lead pitch (spacing between adjacent leads). Consequently, the inner leads $8a_1$ are displaced from their corresponding bump electrodes 15. Also, as shown in side view V2 of FIG. 29, lead frame 8 itself warps, so the inner leads $8a_1$ rise at both ends, and may even separate from the bump electrodes 15.

One cause of the positional dislocation of the inner leads from their corresponding bump electrodes is that the lengths of base film 7 and the inner leads from support point (A) increase during inner lead bonding because of vertical gap 22.

Therefore, an object of my invention is to provide a TCP which eliminates dislocation of the lead bonding positions, provides more reliable bonding, maintains a fixed gap between the base material 7 and the opposite chip face, and coats the sealing resin evenly over the IC chip surface and sides.

SUMMARY OF INVENTION

My invention relates to a semiconductor device in which the lead on the base material is bonded to the semiconductor chip and a support for receiving and supporting the base material during the bonding of the base material and the semiconductor chip.

The support provided between the base material and the semiconductor chip is formed to receive and support the base material during bonding so the support point function of the base material in the inner lead bonding process is carried out by the support when the support has a thickness (height) of the gap between the base material and the semiconductor chip. Thus the distance between the support point and the force point can be considerably reduced. When the thickness (height) of the support is small, displacement around the support point of the base material is generated only until the base material contacts the support, so the amount of displacement is smaller with the support than without it.

As a result, along with the deformation generated in the base material being noticeably reduced, influence on the inner lead bonding according to the displacement of the base material is reduced making it possible to greatly reduce the positional dislocation during bonding.

Also, the length from the support point of the base material is reduced by the support according to the support and the base material is supported stably during bonding so it is possible to reduce the influence that the stress applied to the lead during bonding has on both ends in the chip length direction, greatly reduce the lead deformation and displacement, and change and rise in the lead pitch, and execute bonding with favorable reliability.

In my invention, the support can be provided as a projection on the semiconductor chip or as a projection on the base material.

Specifically, my invention is formed with an aperture that

My invention also targets the IC itself and not only packages, such as TCPs. In the case of a package, the resin used to seal a lead frame and IC chip is targeted, and in the case of the IC chip itself, an IC chip provided with the support (e.g., dummy bump electrode) is targeted.

BRIEF DESCRIPTION OF THE DRAWINGS

FIG. 7 is a perspective view of a first arrangement of actual and dummy bump electrodes (spacer projections) on the IC chip of the semiconductor device of FIG. 1.

FIG. 8 is a top view of a second arrangement of actual and dummy bump electrodes on the IC chip of the semiconductor device of FIG. 1.

FIG. 9 is a perspective view of a third arrangement of actual and dummy bump electrodes on the IC chip of the semiconductor device of FIG. 1.

Figure 1:
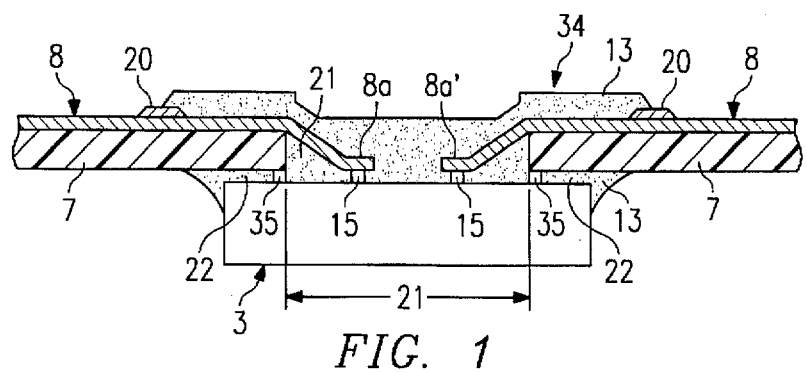
FIG. 1 is a cross section of a first embodiment of a semiconductor device (TCP using upward-facing method) according to my invention.

In the figures, 3 is an IC chip, 7 a base film, 8 a lead frame, 8a, 8a' inner leads, 8b, 8b' outer leads, 9 an LCD display, 10 an LCD panel substrate, 13 a sealing resin, 14, 24, 34 semiconductor chip packages, 15 bump electrodes, 16 a printed-wiring substrate, 20, 50 solder resists, 21 a device hole, 22 a gap, 30 a bonding tool, 31 a bonding stage, 32 a bonding clamp, 33 a bonding guide, 35 a dummy bump electrode, 55 a projection, 60 a conductive thin-film electrode, 70 an anisotropic conductive film, 80 a conductive electrode, (A) a support point, (B) a force point, and (C) a function point.

DETAILED DESCRIPTION

FIGS. 1–10 show embodiments applying my invention to TCPs. In the TCP 34 of FIG. 1, a lead frame 8 is attached to a base film 7 having a device hole 21 smaller than the corresponding IC chip 3. As in the conventional structure of FIGS. 23 and 25–27, there is a fixed gap 22 between base film 7 and IC chip 3, the lead frame's inner leads 8a, 8a' are bonded to bump electrodes on the chip, and the same part numbers are used for parts similar to those in the conventional structure. However, this novel TCP structure additionally provides the upward-facing surface of IC chip 3 with many spacer projections or dummy electrodes 35, shaped similar to the actual bump electrodes 15, projecting upwards across gap 22.

Dummy bump electrodes 35 have approximately the same vertical height as gap 22 and are provided in rows at a prescribed pitch (spacing between adjacent members) along both sides of IC chip 3. Each row of dummy electrodes 35 is laterally positioned about at function point (C), the edge of base film 7 around device hole 21.

As shown in FIG. 7, dummy bump electrodes 35 are provided within each area 81 on both sides of two rows 80 of actual bump electrodes 15. In the example of FIG. 7, the dummy bump electrodes 35 are positioned with the same pitch as actual bump electrodes 15, but other pitches could be used.

Preferably bump electrodes 35 are provided with an equal pitch or equivalent distribution from the point of view of the function and effect to be discussed later. Also, the pitch of dummy bump electrodes 35 is normally 1–100 times the pitch of the actual bump electrodes 15, preferably 2–80 times the pitch, and most preferably 2–10 times the pitch. When the pitch of dummy bump electrodes 35 is too small, bond formation becomes difficult, and if the pitch is too large, the dummy electrodes are not effective in preventing deformation of base film 7. FIG. 8 shows a specific example with a dummy/actual electrode pitch ratio of 2:1. In another example, each dummy bump electrode 35 of FIG. 9 is as wide as the result of fusing two adjacent actual electrodes 15.

In the TCP 34 shown in FIG. 1, an example of dimensions for each part are: semiconductor chip: 1.300 mm wide, length 17.200 mm long; device hole: 0.800 mm wide, overlap of hole and chip: 0.250 mm; number of actual bump electrodes: 240, pitch: 0.069 mm (in FIG. 8); distance between rows of actual bump electrodes: 0.300 mm; number of dummy bump electrodes: 120, pitch: 0.138 mm (in FIGS. 7 and 8), distance between rows of dummy bump electrodes: 0.900 mm; planar area of actual and dummy bump electrodes: 0.063×0.063 mm on one side of chip centerline, 0.053×0.053 mm for those on the other side; thickness of gap 22 and height of actual and dummy bump electrodes: 18 μm; thickness of base film: 75 μm or 125 μm; thickness of lead frame 8 (inner leads 8a and 8a'): 18 μm, 25 μm, or 35 μm.

Figure 2:
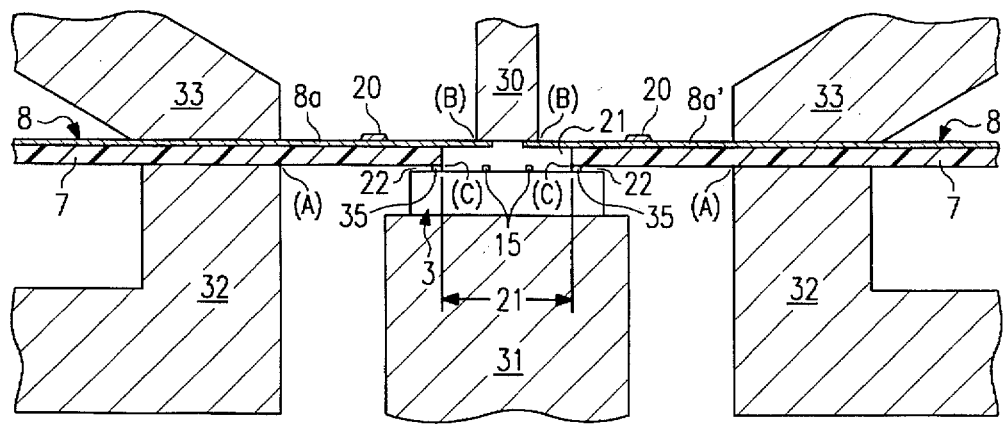
FIG. 2 is a cross section of one step in an inner lead bonding process for the semiconductor device of FIG. 1.
Figure 3:
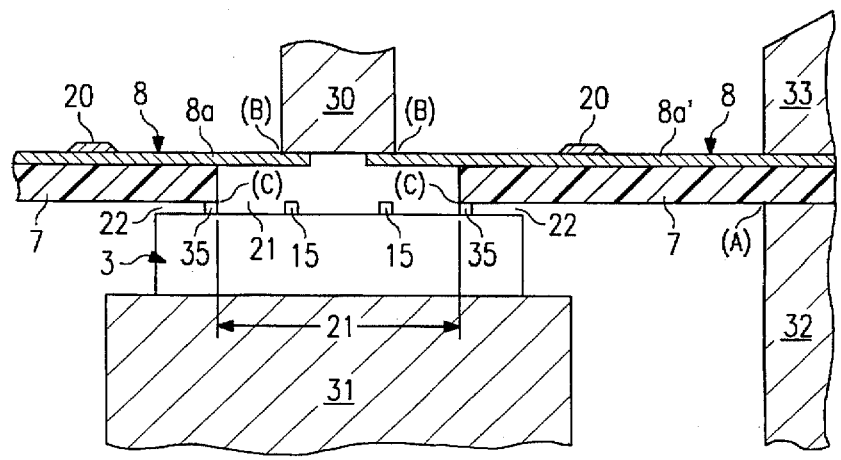
FIG. 3 is a partially enlarged view of FIG. 2.

Here is how my novel TCP 34 using IC chip 3 having dummy bump electrodes 35 works for inner lead bonding and resin sealing process. As shown in FIG. 2, inner lead bonding begins by arranging a bonding tool 30, a bonding stage 31, a base film clamp 32 and a base film guide 33 with respect to an IC chip 3 and a flexible base film 7, so there is a gap 22 between the upper face of chip 3 and the lower face of base film 7. As shown in FIG. 3, the upper face of IC chip 3 is provided with dummy bump electrodes 35 having the same vertical height as gap 22 so that even if bonding tool 30 applies pressure to inner leads 8a, 8a' at force point (B), gap 22 is maintained because dummy bump electrodes 35 prevent base film 7 from being elastically deformed about support point (A). Therefore, the amount of displacement of base film 7 is minimal and deformation does not accompany the displacement.

Figure 4:
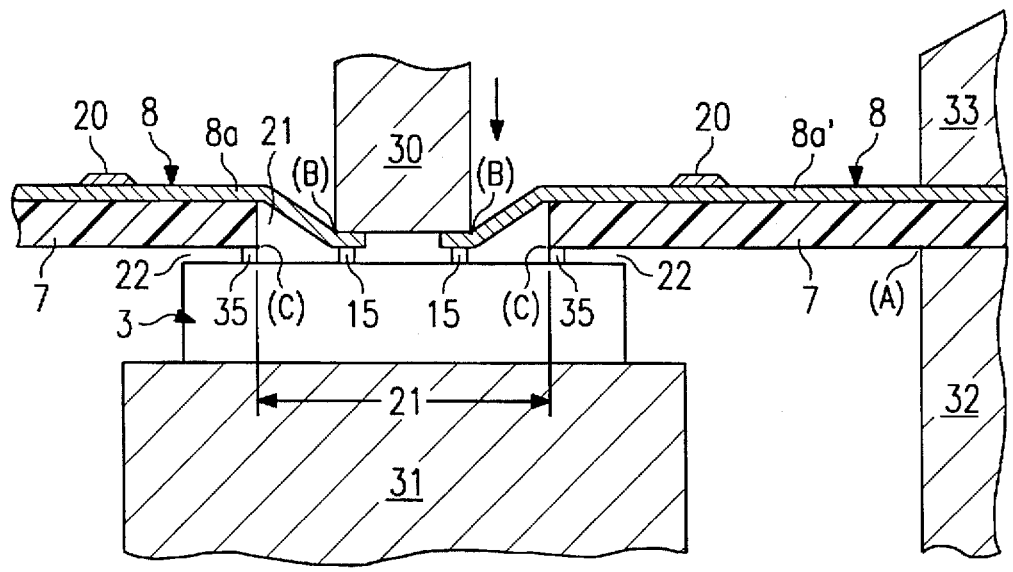
FIG. 4 is a cross section of further step in the inner lead bonding process of FIG. 3.

Then bonding tool 30 is pushed down as in FIG. 4, deforming inner leads 8a and 8a' by rotating them until they come into contact with chip 3's bump electrodes 15, to which they are bonded by heating. Because base film 7 is supported by bump electrodes 35, it is not deformed and only inner leads 8a, 8a' are deformed within device hole 21.

Figure 5:
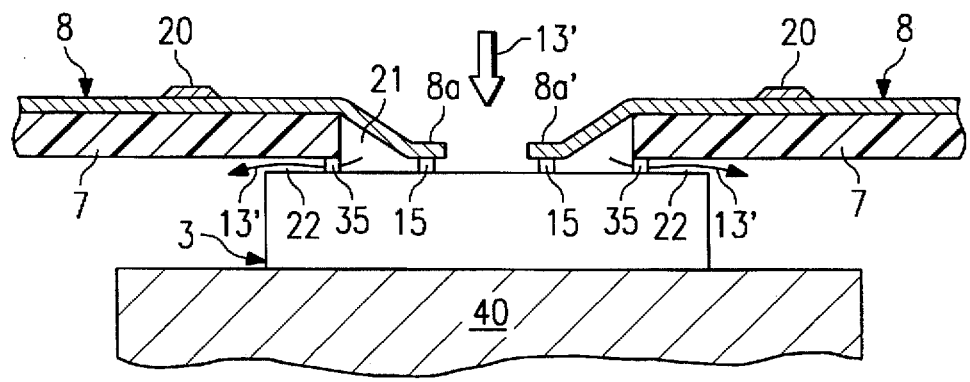
FIG. 5 is a cross section of a resin sealing process applied after the lead bonding the device of FIG. 1.
Figure 6:
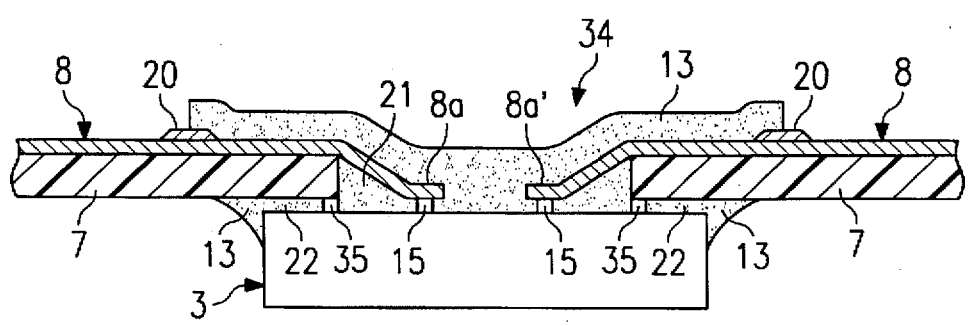
FIG. 6 is a enlarged cross section of the semiconductor device after the resin process sealing of FIG. 5.
Figure 10A:
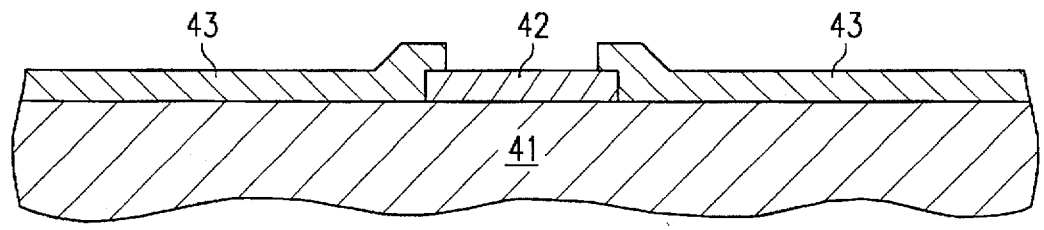
FIG. 10 is a series of steps (1–6) in cross section of a method of making actual and dummy the bump electrodes.
Figure 10B:
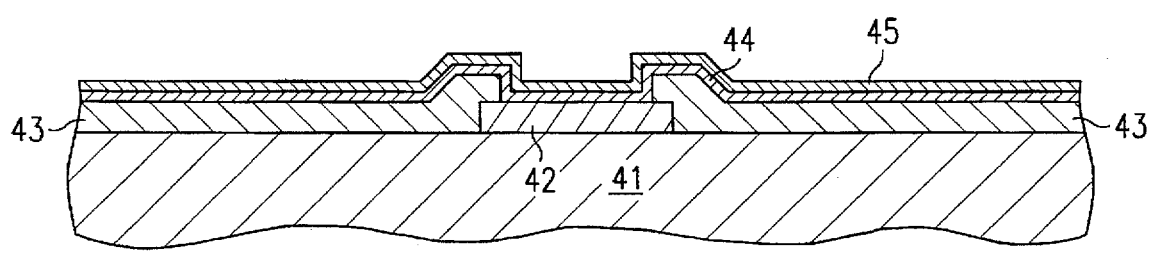
Figure 10C:
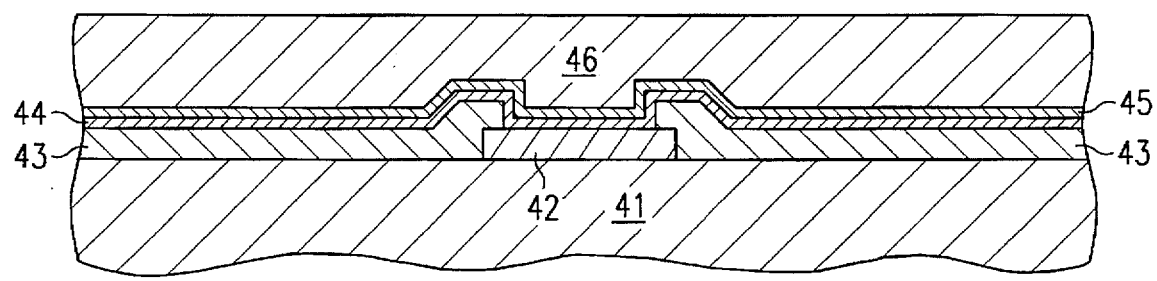
Figure 10D:
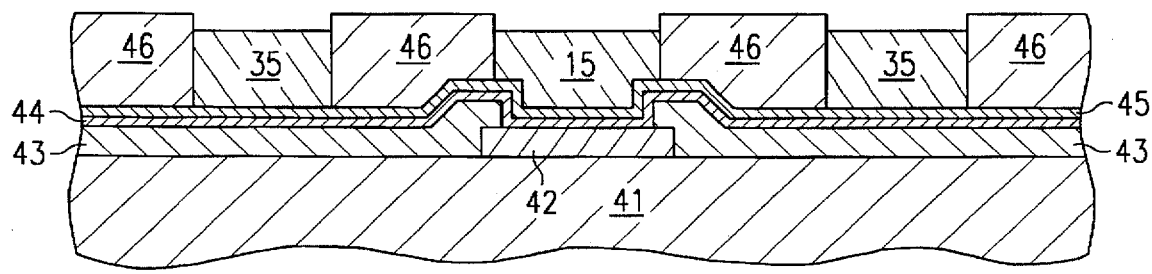
Figure 10E:
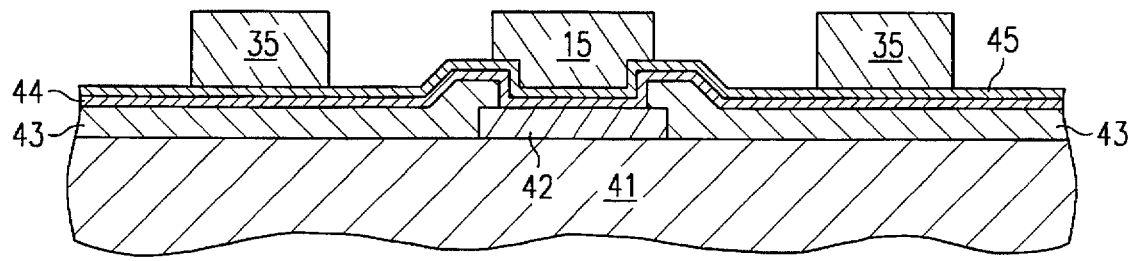
Figure 10F:
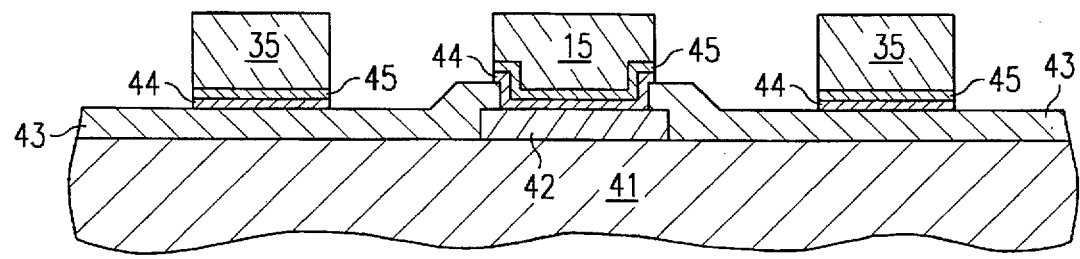

After inner leads 8a and 8a' are bonded to bump electrodes 15 using the upward facing method, IC chip 3 is placed on a support stand 40 as shown in FIG. 5 and a sealing resin liquid 13' is dripped over the leads and chip. Because gap 22 is maintained by spaced dummy bump electrodes 35, resin liquid 13' flows smoothly from the top of IC chip 3 to the sides through the gap as indicated by the arrow in FIG. 5. When the resin sets, TCP 34 is sealed from the upper surface of IC chip 3 to its end or side surface of chip 3 as in FIG. 6.

The dummy bump electrodes 35 provided between base film 7 and IC chip 3 receive and support base film 7 during the bonding of the inner leads. Because dummy bump electrodes 35 have the same vertical dimension as gap 22, during inner lead bonding process the dummy bump electrodes 35 become the support point for base film 7, greatly reducing the distance between the support point of base film 7 and the force point of bonding tool 30. As shown in FIG. 4, because the vertical dimension of dummy bump electrodes 35 is the same as gap 22, there is barely any displacement around the support point (A) of base film 7.

By noticeably reducing the deformation of base film 7, the unwanted displacement of inner leads 8a, 8a' such deformation can cause during inner lead bonding is eliminated and positional dislocation in the bonding is considerably reduced.

Also, the length from the support point of base film 7 is eliminated by the support according to bump electrodes 35 and base film 7 is supported stably during bonding so the influence that the stress applied to the inner lead during bonding has on both ends in the length direction of the chip is reduced, the deformation and displacement in the inner lead and change and rise in the lead pitch are considerably reduced, and bonding can be more reliably carried out.

In addition to preventing deformation of base film 7, the dummy bump electrodes 35 provided as a spacer on chip 3 improve the resin seal by maintaining a stable gap 22 between chip 3 and base film 7. The resin liquid 13' flows smoothly through the gap, evenly coating the chip surface, thereby stabilizing the reliability and quality of the TCP package. With a stable gap, the amount of resin liquid 13' flowing through it can be predetermined according to the resin liquid composition, facilitating control of the resin sealing process.

The dummy bump electrodes need not be provided on the circuit formation surface of chip 3; they can be created simultaneously with the formation of regular bumps on the passivation film of chip 3, and at such a time, wiring leads or active and passive elements can be placed in the underlayer of bump electrodes 35. Therefore, dummy bump electrodes 35 can be provided without adding a special process or changing the size or area of chip 3, so there is only a slight addition of material cost.

Dummy bump electrodes 35 provided on the passivation film can be arranged arbitrarily as long as they are on the passivation film and their shape can be designed arbitrarily. So in addition to their role as a spacer and stop to prevent deformation of base film 7, they can be used to mark positions in the bonding process for joining chip 3 and base film 7.

Next, a method for creating bumps, including dummy bump electrodes 35, on a passivation film will be explained with reference to the numbered steps of FIG. 10. In Step {1} an aluminum pad 42 connected to the internal circuitry is formed on a principal surface of a silicon substrate 41 of a semiconductor chip, and then a passivation film 43 (actually a multilayer film) is deposited so that the top surface of pad 42 is exposed.

At Step 2 a Au layer 45 and a TiW layer 44 as barrier

Specifically, my invention is formed with an aperture that is smaller than the semiconductor chip in the base film provided with a lead, the semiconductor chip is arranged with a prescribed gap between it and the base film to cover the aperture, the inner part of the lead extends through the aperture from the top of the base film and is bonded to the semiconductor chip through the aperture, and a projection for receiving the displaced part on the base film, which is displaced during the bonding, is provided to the gap as a support.

In this case, the inner lead can be bonded to the bump electrode of the semiconductor chip and a spacer projection for receiving the displaced part of the base film can be provided on the semiconductor chip as a dummy bump electrode.

The spacer projection or dummy bump electrode can be provided on the passivation film of the semiconductor chip.

The support can function as a spacer which maintains the gap between the semiconductor chip and the base material in addition to supporting the base material.

electrodes 35 on passivation film 43 with a prescribed pattern. The TiW layer 44 has a barrier function that prevents Au atoms from diffusing into the substrate when executing annealing during the formation of the bump electrodes. Au layer 45 increases the adhesion of Au layers 15 and 35 with respect to TiW layer 44.

Figure 11:
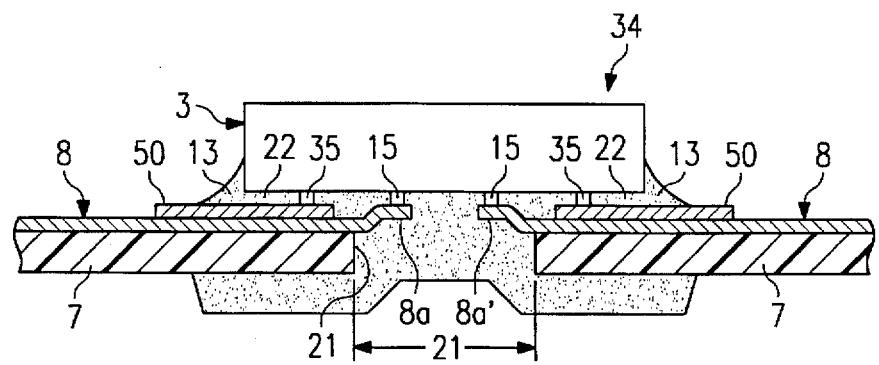
FIG. 11 is a cross section of a second embodiment of a semiconductor device (TCP using downward-facing method) according to my invention.
Figure 12:
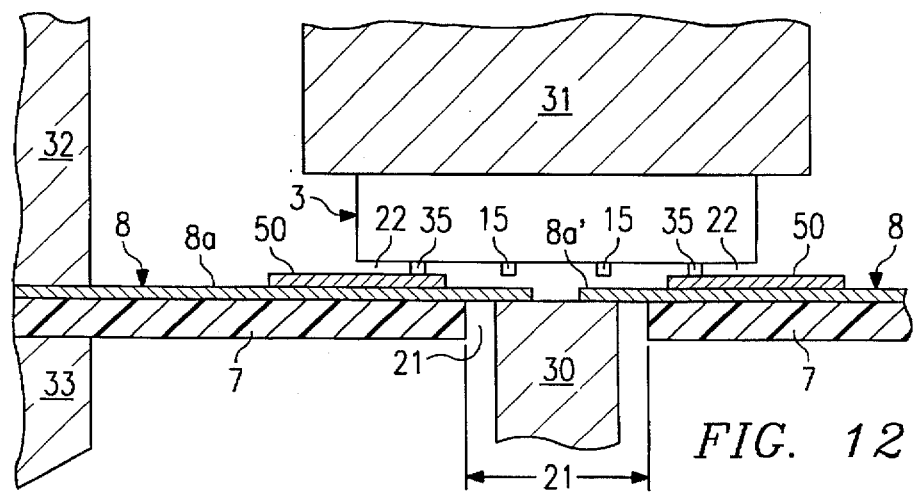
FIG. 12 is a partial cross section of one step in an inner lead bonding process for the semiconductor device of FIG. 11.
Figure 13:
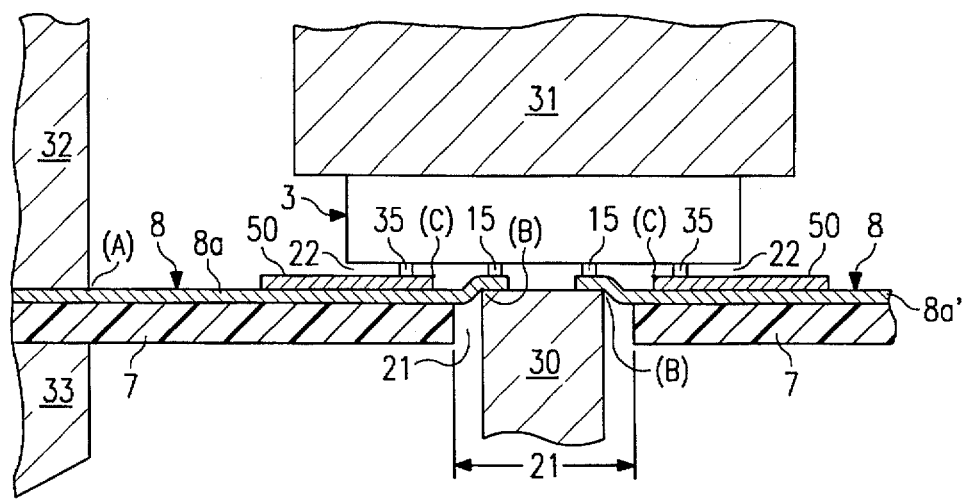
FIG. 13 is a cross section of further step in the inner lead bonding process of FIG. 12.

FIGS. 11–13 show another embodiment in which my invention is applied to a TCP with a semiconductor chip manufactured using the downward facing method. For this TCP, IC chip 3 is mounted above rather than below the base film. As shown in FIG. 11, solder resist 50 is coated to a fixed thickness on the lead formation surface of a base film 7. By providing dummy bump electrodes 35 on the bottom face of chip 3, it is possible to prevent deformation, etc., of base film 7 which might otherwise occur during bonding of the inner leads while with maintaining a fixed gap between solder resist 50 and chip 3.

During the inner lead bonding process shown in FIG. 12, bonding is carried out by applying a bonding tool 30 from below, elastically deforming inner leads 8a and 8a' by moving bonding tool 30 upward as shown in FIG. 13 to make them contact bump electrodes 15. If dummy bump electrodes 35 were not present, base film 7 would rotate around support point (A) until function point (C) of solder-resist 50 came into contact with chip 3, deforming base film 7. Providing dummy bump electrodes 35 near function point (C) prevents base film 7 from rotating around support point (A). Here, bonding tool 30 is shown acting from below to make the difference according to the orientation of the chip easy to understand, but in the actual manufacturing FIG. 12 is inverted and the bonding tool acts downward from the top.

In this way the displacement of base film 7 is greatly reduced or eliminated and mounting (bonding) of the chip can be executed favorably by the downward facing method without generating deformation accompanying displacement.

Also, gap 22 is maintained by dummy bump electrodes 35 after bonding, so it is possible to carry out resin sealing because the resin liquid flows smoothly through gap 22. Dummy bump electrodes 35 are provided in the same manner as the aforementioned embodiment so the same effects as those mentioned above can be obtained.

Figure 14:
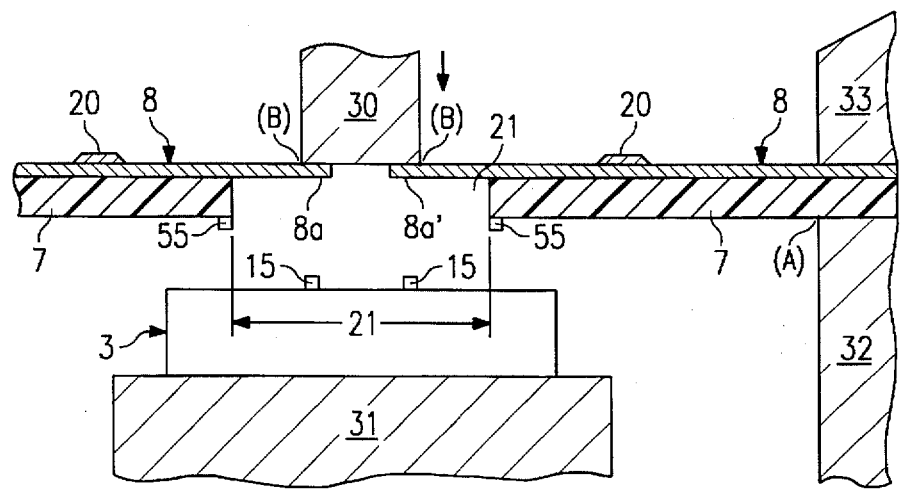
FIG. 14 is a cross section of one step in making a third embodiment of a TCP semiconductor device in which there are downward projections on a base film near a device hole in it.

FIG. 14 shows yet another embodiment in which spacer projections 55, corresponding to the dummy bump electrodes 35, are provided on base film 7 rather than chip 3. Spacer projections 55 are integrally provided with base film have free ends.

Figure 15:
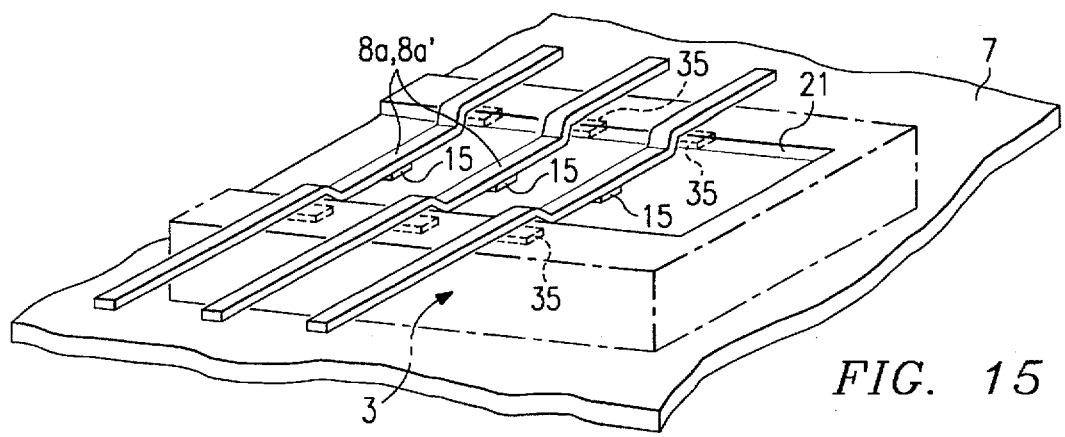
FIG. 15 is a perspective view of a fourth embodiment of a semiconductor device (TCP using upward-facing method) according to my invention in which the inner leads do not have free ends.
Figure 16:
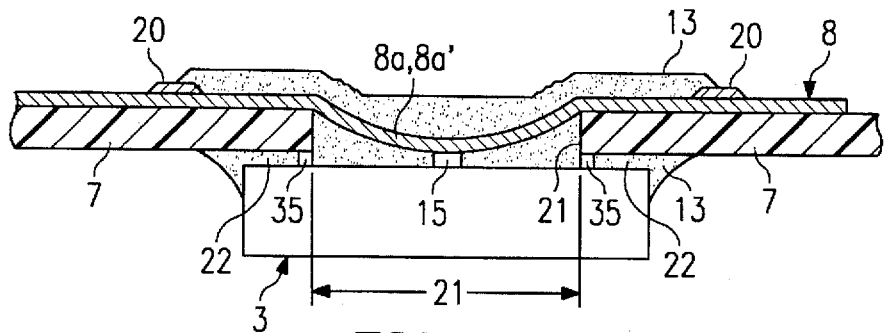

FIG. 16 a is an partial enlarged cross section of the semiconductor device of FIG. 15.

Figure 17:
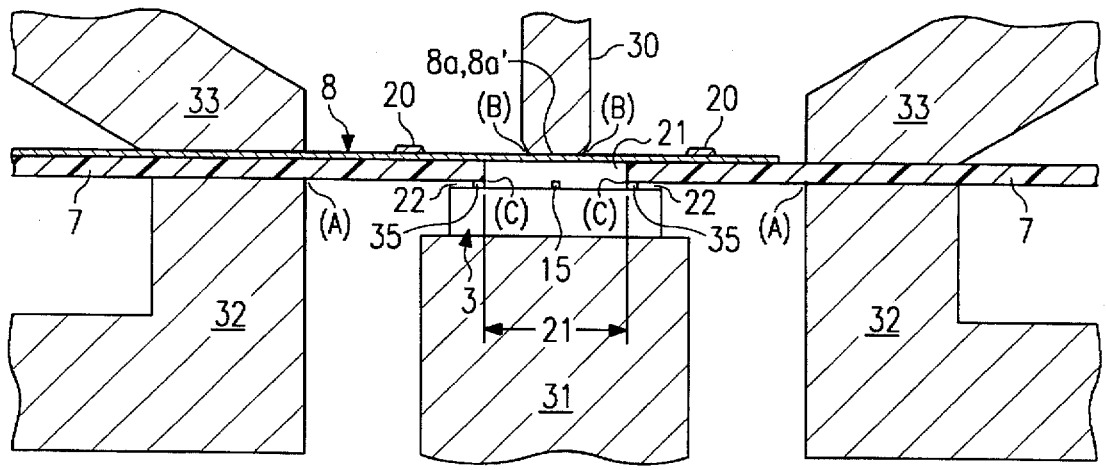

FIG. 17 is a cross section showing one step in an inner lead bonding process of the semiconductor device of FIG. 15.

Figure 18:
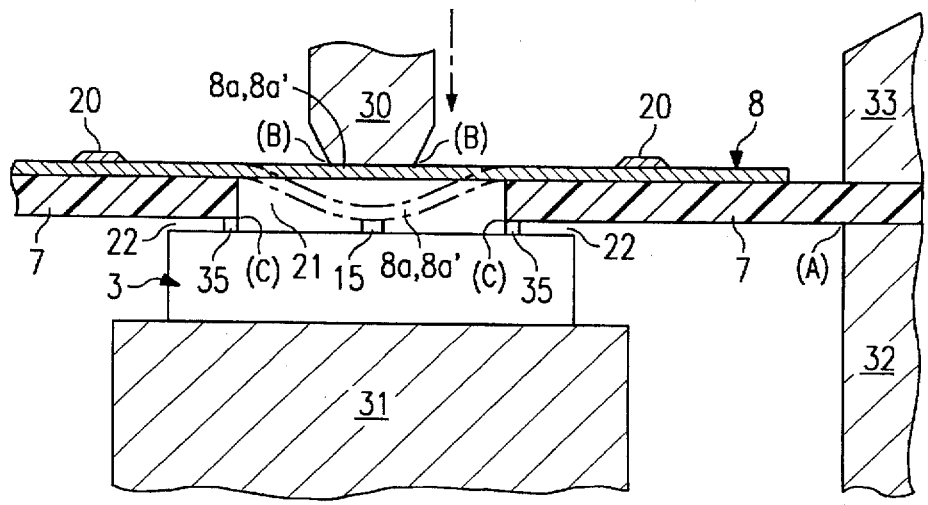

FIG. 18 is a cross section showing a further step in the inner lead bonding process of FIG. 17.

Figure 19:
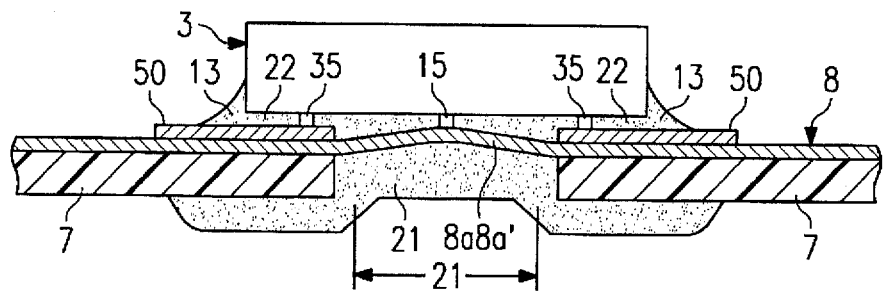

FIG. 19 is a cross section of a fifth embodiment of a semiconductor device (TCP using downward-facing method) according to my invention in which the inner leads do not have free ends.

Figure 20:
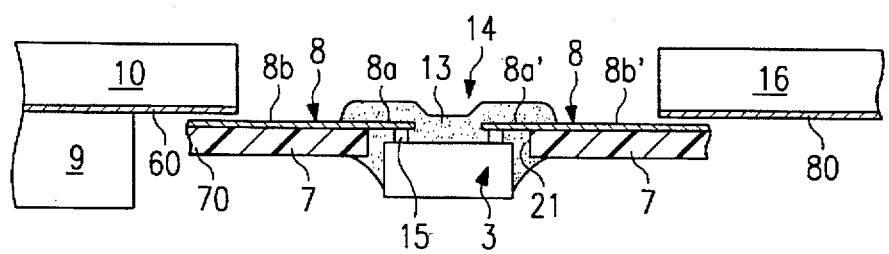

FIG. 20 is a sectional view of a conventional TCP structure for connecting an LCD driver chip between an LCD panel and a printed wiring substrate by a conventional upward-facing TAB method.

Figure 21:
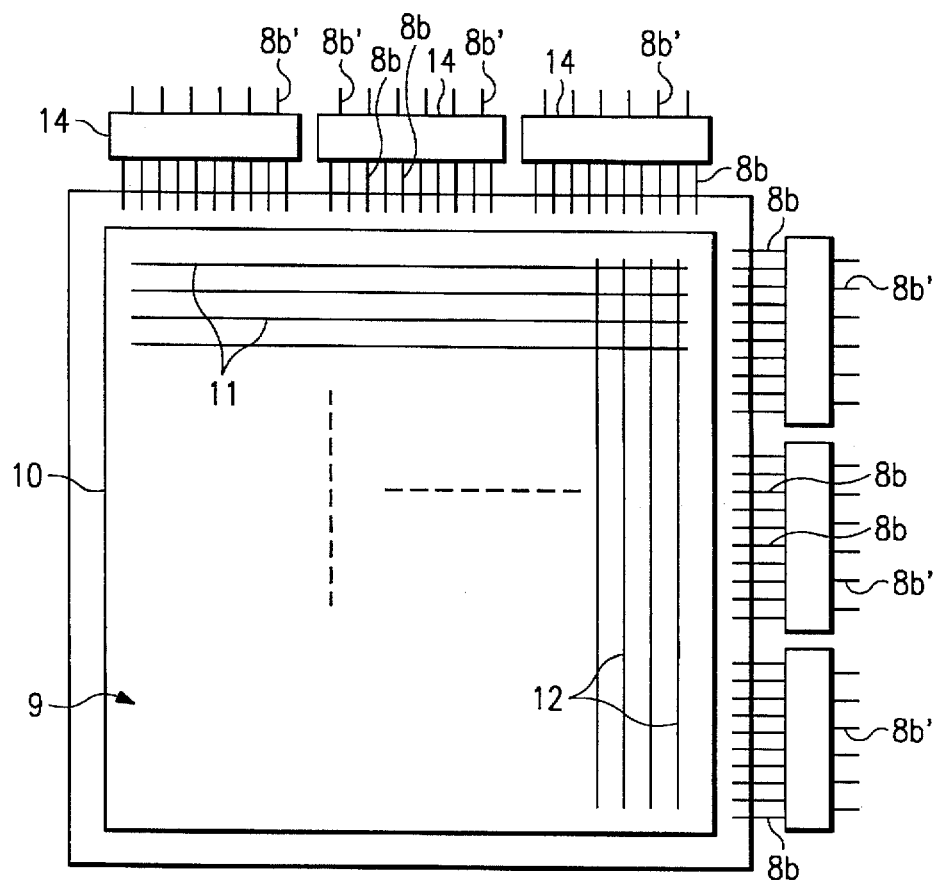
Figure 22:
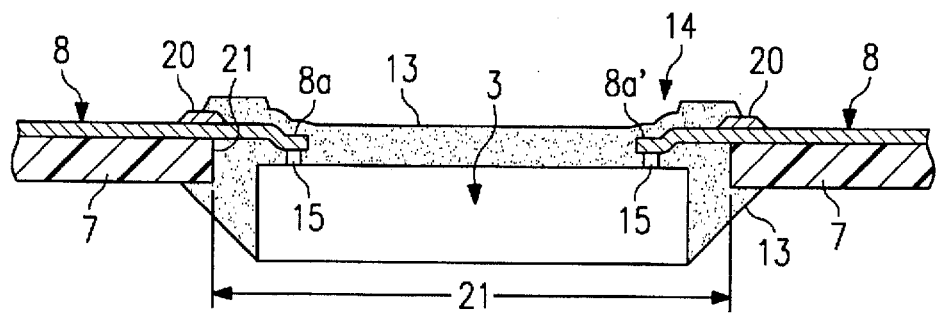
FIG. 22 is an enlarged cross section of the conventionally packaged semiconductor device of FIG. 20.
Figure 23:
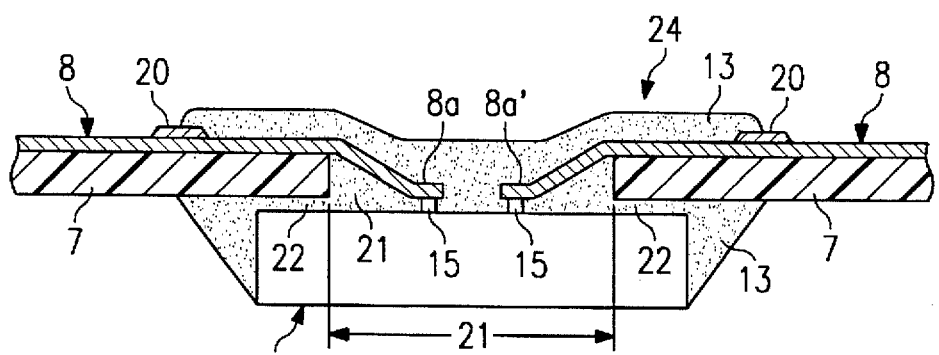
FIG. 23 is a cross section of another packaged semiconductor device having a different structure.
Figure 24:
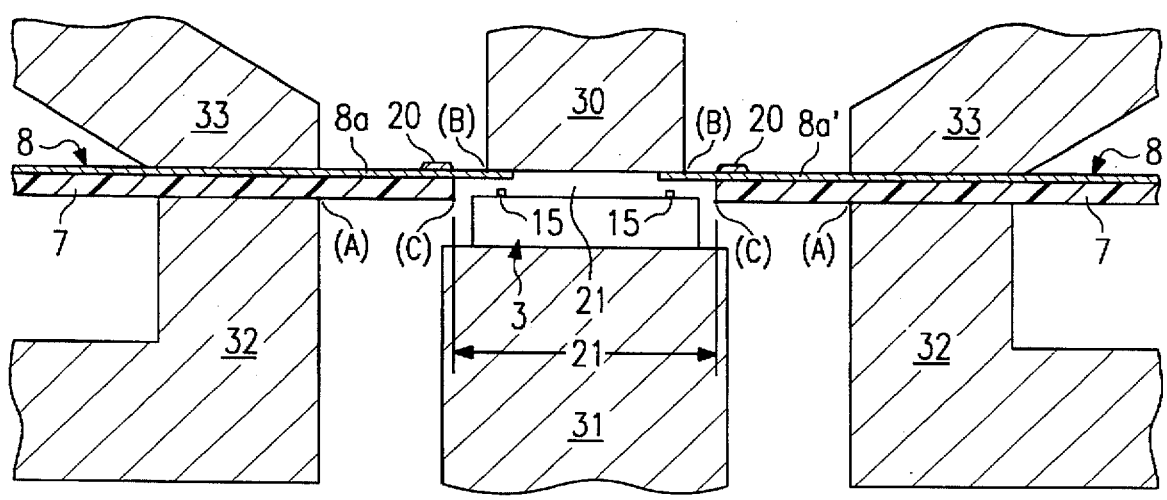
FIG. 24 is a cross section showing one step in the inner lead bonding process of the semiconductor device of FIG. 22.
Figure 25:
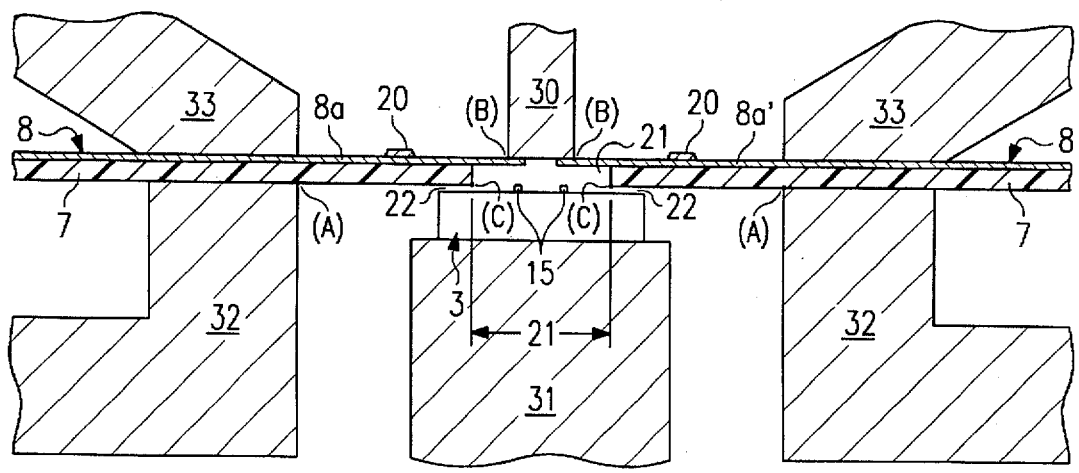
FIG. 25 is a cross section-showing one step in the inner lead bonding process of the semiconductor device of FIG. 23.
Figure 26:
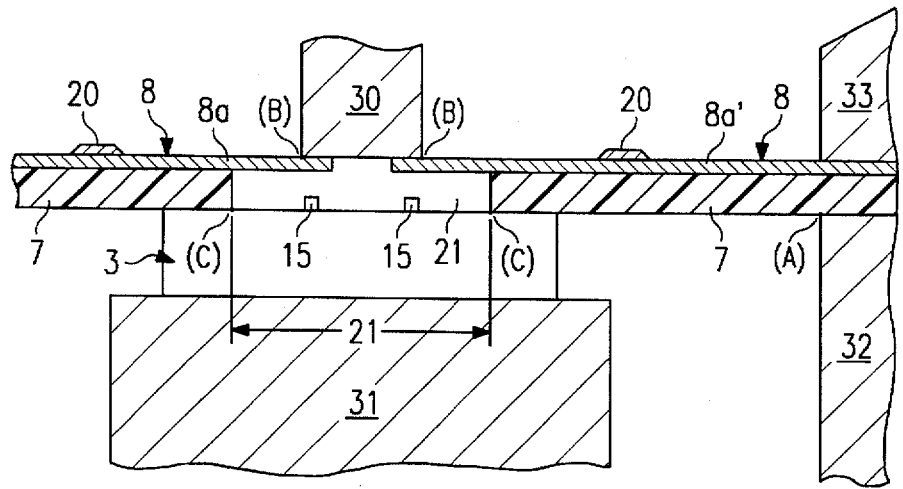
FIG. 26 is a enlarged partial view of the bonding process of FIG. 25.
Figure 27:
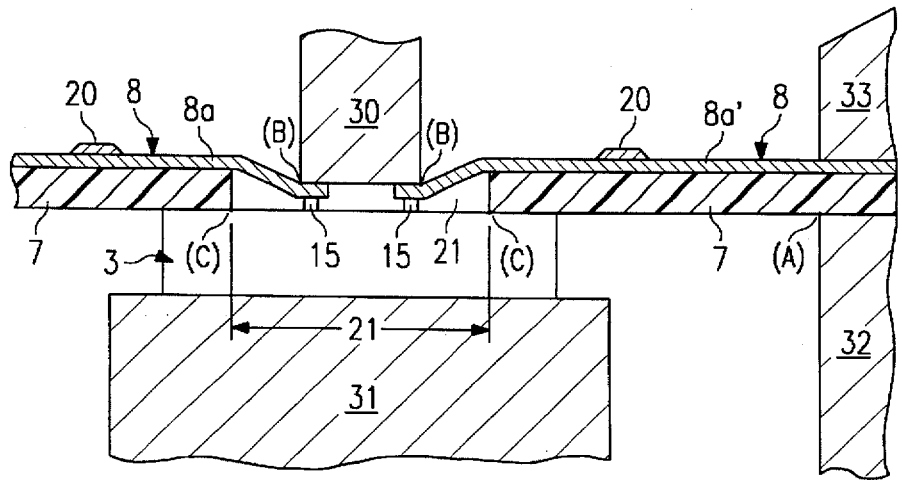
FIG. 27 is a cross section showing a further step in the lead bonding process of FIG. 26.
Figure 28:
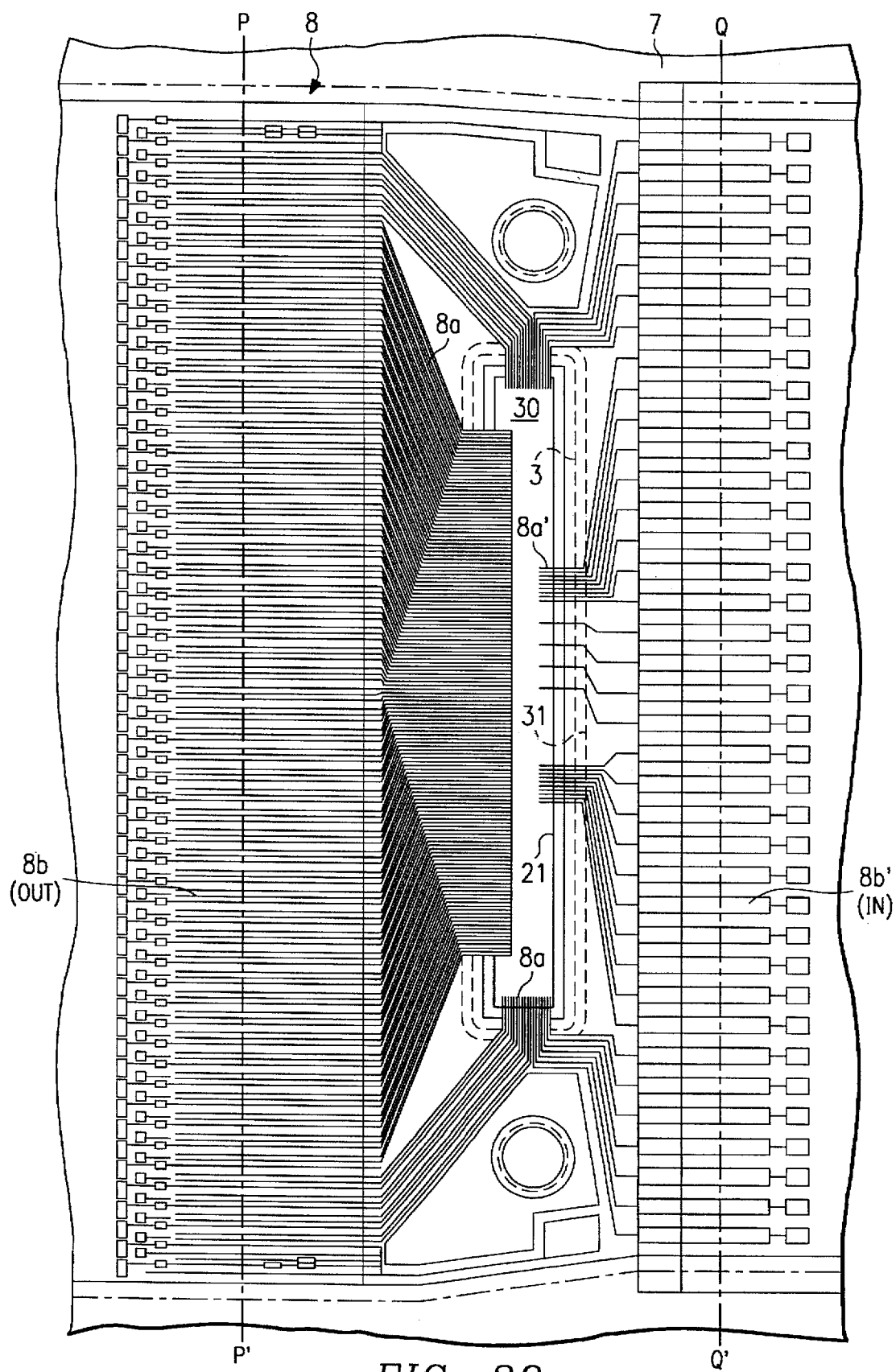
FIG. 28 is a top plan view of a lead frame for TAB mounting an IC chip of a semiconductor device.
Figure 29:
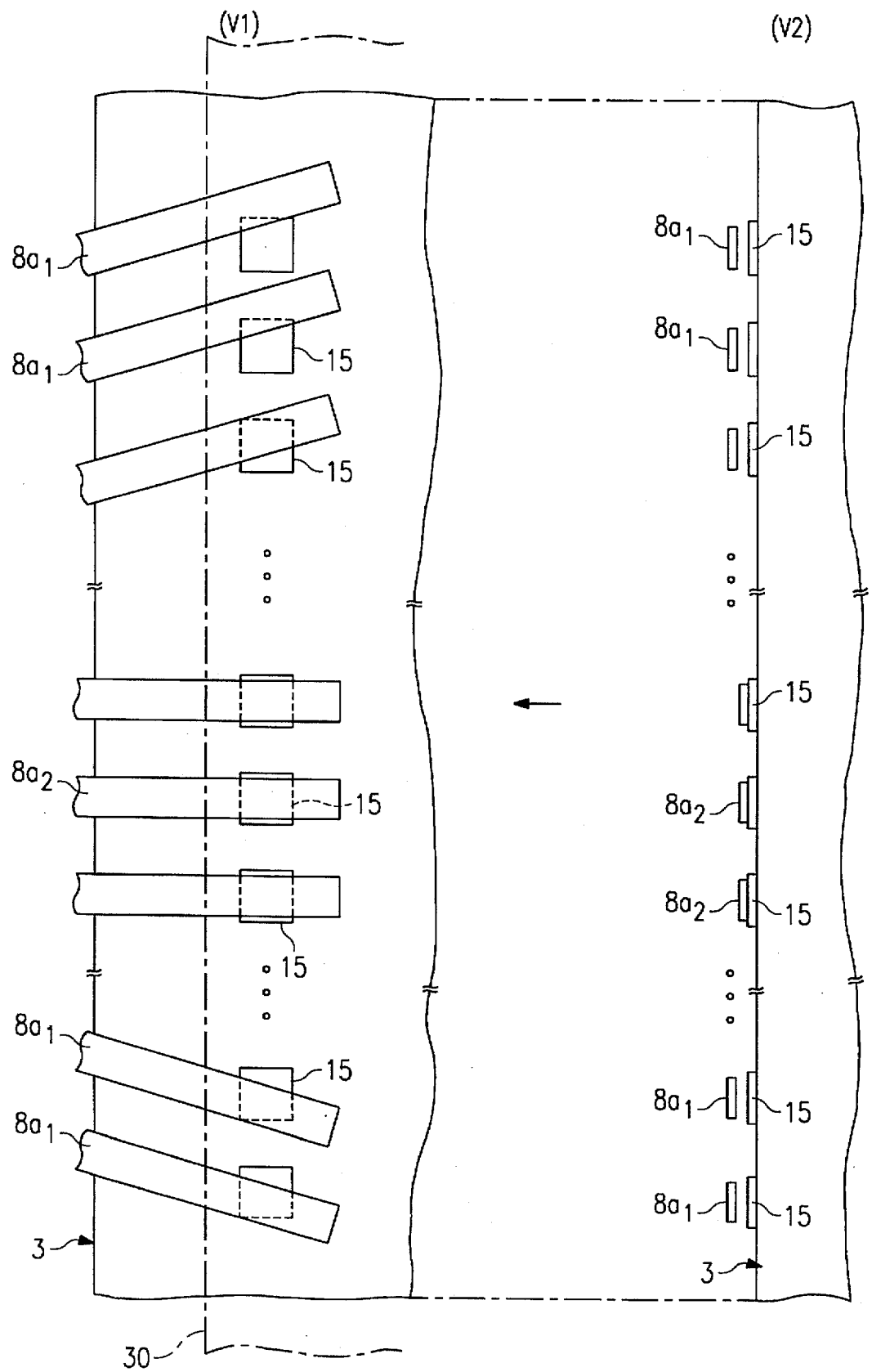
FIG. 29 is an enlarged partial top plan view (VI) and an enlarged side view (V2) of the lead frame of FIG. 28 after its inner leads are bonded to bump electrodes on a semiconductor chip.

FIG. 21 is a schematic top plan view of an LCD panel with several of the LCD driver chip packages of FIG. 20 peripherally attached.

each inner lead 8a, 8a' on base film 7 bridging device hole 21 is bent into the hole to be bonded at its center to a corresponding bump electrode 15 on chip 3.

As shown in FIG. 17, inner lead bonding begins by arranging a bonding tool 30, a bonding stage 31, a base film clamp 32 and a base film guide 33 with respect to an IC chip 3 and a flexible base film 7 carrying a lead frame 8 whose inner leads 8a, 8a' each bridge a hole in base film 7. A gap 22 is provided between the upper face of chip 3 and the lower face of base film 7.

Bonding tool 30 presses down on the center of each inner lead 8a, 8a' as shown in FIG. 18 until each inner lead comes into contact with a corresponding bump electrode 15 (as indicated by the broken line) and bonding is carried out by the upward facing method. Because two rows of upward-facing dummy bump electrodes 35 on IC chip 3 have the same vertical dimension as gap 22, the benefits of the previous embodiments can be obtained, such as receiving base film 7 during inner lead bonding, reducing the displacement of base film 7, etc.

Because the inner lead straddles the device hole 21 and does not have a free end, deformation or positional dislocation does not easily occur as a result of stress, vibration, etc. Moreover, the bridged inner leads also reinforce base film 7 near device hole 21, enhancing the base film's physical strength and resistance to external forces, such as impact, contact, etc., helping it to remain flat near device hole 21.

Even when the inner leads are made narrow, for example, 30 μm or less, each inner lead 8a, 8a' is stably maintained at the prescribed position, does not stick out or separate from the row of inner leads, and the flatness of the row of inner leads is stably maintained. Consequently, contact defects are not generated in the inner lead bonding process, all inner leads 8a and 8a' can be placed in good contact with a corresponding bump electrode 15, and can sufficiently accommodate several pins.

As shown in FIG. 19, after the bonding process, resin 13 is coated at the inner edge of base film 7 and the top and side surfaces of IC chip 3. Since this resin flows sufficiently through gap 22 maintained by dummy bump electrodes 35, a good seal is formed.

The embodiment in FIG. 19 differs from the one of FIGS. 15–18 only in that bonding is carried out using the downward facing method and solder resist 50 is formed on the inner lead (refer to FIGS. 11–13). Therefore, the function and effects noted in the example of FIGS. 15–18 and the example of FIGS. 11–13 can be obtained.

It will be readily apparent to those in the packaging art that the embodiments described above can be modified in various ways without departing from the technological concept of my invention. The formation method, material, formation position, size, and pattern of the projections or dummy bump electrodes can be changed in various ways. For example, in FIGS. 1–10 dummy bump electrodes 35 can be installed on IC chip 3 at a position removed from device hole 21 and even in the example of FIG. 14, projections 55 can be installed on base film 7 at a position removed from device hole 21.

Also, the pattern, size, formation position, material, formation method, etc., can be changed even with regard to bump electrodes 15 of IC chip 3. Also, the bonding method can be changed including the shape and material of the lead frame.

In the embodiments, packaging for an LCD driver was mainly shown, but my invention can be applied to packaging various other semiconductor devices.

My invention has a structure in which the inner lead provided on a base material is bonded to a semiconductor chip and a support for receiving and supporting the base material during bonding is provided between the base material and the semiconductor chip. The support receives and supports the base material during bonding, and the function of the support point of the base material in the inner lead bonding process is executed by the support; thus the distance between the support point and the force point can be reduced considerably and the displacement around the support point of the base material reduced considerably.

Besides noticeably reducing the deformation created in the base material, my invention reduces the influence of displacement of the base material on the inner lead, thus the positional dislocation between the inner leads and bump electrodes during bonding is considerably reduced.

The length from the support point of the base material becomes short due to the support by dummy bump electrodes, and the base material can be supported stably during bonding so the influence that the stress applied to the lead during the bonding has on the two ends in the length direction of the chip can be reduced, deformation and dislocation of the lead, change and rise in the lead, etc., can be reduced considerably, and bonding can be carried out with favorable reliability.

The dummy bump electrodes function as a spacer for maintaining a fixed gap between the opposite surfaces of the chip and the base material and the sealing resin can be coated evenly on the chip surface and the end or the side surface through the gap so stabilization and improvement in the reliability and quality of the resin sealed package can be realized.

I claim:

1. A semiconductor assembly for TCP packaging, comprising:

an IC chip containing a circuit and having a connection face provided with a plurality of bump electrodes coupled to the circuit;

a flexible base film (i) having a device hole smaller than the IC chip's connection face and facing it at a predetermined sealing gap distance and (ii) attached to a plurality of conducting leads having unattached inner lead portions extendible through the device hole for bonding to corresponding bump electrodes of the IC chip; and a plurality of spacer projections, of a height equal to the sealing gap distance, disposed around the device hole between the base film and the chip's connection face for maintaining the gap distance when the inner lead portions are bonded to the bump electrodes and a sealant is poured in the device hole.

2. The assembly of claim 1 wherein the spacer projections are formed on the connection face of the IC chip.

3. The assembly of claim 1 wherein the spacer projections are formed as dummy bump electrodes on the connection face of the IC chip.

4. The assembly of claim 1 wherein the spacer projections are formed as dummy bump electrodes on a passivation film of the semiconductor chip.

5. The assembly of claim 1 wherein the spacer projections are formed on the base film.

6. The assembly of claim 1 wherein the unattached inner lead portions have free ends, each extendible through the device hole for bonding to a corresponding bump electrode of the IC chip.

7. The assembly of claim 1 wherein the the unattached inner lead portions bridge the device hole.

8. A semiconductor device comprising:

an IC chip containing a circuit and having a connection face provided with a plurality of bump electrodes coupled to the circuit;

a flexible base film (i) having a device hole smaller than the IC chip's connection face and facing it at a predetermined gap distance and (ii) attached to a plurality of conducting leads having inner lead portions extending through the device hole and bonded to corresponding bump electrodes of the IC chip;

a plurality of spacer projections, of a height equal to the gap distance, disposed around the device hole between the base film and the chip's connection face for maintaining the gap distance; and a sealant covering the inner lead portions, filling the device hole and the gap distance between the IC chip and flexible base film, and covering the IC chip's connection face.

9. The semiconductor device of claim 8 wherein the unattached inner lead portions have free ends extending through the device hole, each bonded to a corresponding bump electrode of the IC chip.

10. The semiconductor device of claim 8 wherein the the inner lead portions bridge the device hole.

11. A method of assembling a TCP semiconductor device, comprising the steps of:

providing an IC chip containing a circuit and having a connection face provided with a plurality of bump electrodes coupled to the circuit;

providing a flexible base film (i) having a device hole smaller than the IC chip's connection face and facing it at a predetermined sealing gap distance and (ii) attached to a plurality of conducting leads having unattached inner lead portions;

providing a plurality of spacer projections, of a height equal to the sealing gap distance, disposed around the device hole between the base film and the chip's connection face for maintaining the gap distance;

pushing the inner lead portions through the device hole and bonding them to corresponding bump electrodes of the IC chip.

12. The method of claim 11, further including the step of pouring a sealant over the inner lead portions to fill the device hole and the gap distance between the IC chip and flexible base film and cover the inner lead portions and the IC chip's connection face.

\* \* \* \* \*

--- metal are laminated on passivation film 43 and pad 42, then in Step 3 the entire surface is coated with a photoresist 46.

In Step 4 photoresist 46 is given a prescribed pattern by exposure and development. Using the remaining photoresist 46 as a mask, Au plating is applied to the barrier metal layer (TiW layer 44/Au layer 45) to form Au bump electrodes 15 for bonding and Au dummy bump electrodes 35 for spacing in areas without photoresist 46.

Step 4 shows Au bump electrodes 15 formed in a row with a row of Au dummy bump electrodes 35 on either side. This differs from FIGS. 7 and 8 in that the actual bump electrodes 15 are in a single row. To provide bump electrodes 15 in two rows, pad 42 is instead formed in two rows beforehand.

In Step 5 photoresist 46 is removed, and then in Step 6 Au layer 45 and TiW layer 44 which are exposed in the areas without the Au layers 15 and 35 are etched away. Because Au layer 45 is very thin, there is little effect on Au layers 15 and 35 from etching.

In this way, one can simultaneously form Au actual bump electrodes 15 on conducting pad 42 and Au dummy bump 7 with the same pattern, size, and thickness as dummy bump electrodes 35 shown in FIG. 7 at the edge of base film 7 bordering device hole 21. These projections 55 can be attached to base film 7, but can be provided by processing base film 7 or integrally formed.

After the chip 3 and base film 7 of FIG. 14 are positioned as in FIG. 3, inner lead bonding is carried out in the same manner as shown in FIG. 4. When base film 7 attempts to rotate around support point (A), projection 55 contacts the top surface of chip 3, preventing rotation of base film 7. Therefore, the same function and effects as noted are obtained. Also, IC chip 3 can be a conventional chip, so an additional process is not necessary in the manufacture of the chip.

FIGS. 15–19 show a further embodiment in which my invention is applied to a TCP. Whereas previous embodiments execute bonding by bending the free ends of inner leads 8a and 8a' into a device hole 21, in this embodiment each inner lead provided on base film 7 straddles from one side of hole 21 to the other. As shown in FIGS. 15 and 16,

UNITED STATES PATENT AND TRADEMARK OFFICE
CERTIFICATE OF CORRECTION

PATENT NO.   : 5,744,859
DATED        : April 28, 1998
INVENTOR(S)  : Takayuki Ouchida It is certified that error appears in the above-identified patent and that said Letters Patent is hereby corrected as shown below:

<u>Title page,</u>
Item [30], Foreign Application Priority Data, add:
-- Feb. 28, 1995     [JP]   Japan        7-064,902 --.

Signed and Sealed this

Thirtieth Day of July, 2002

*Attest:*

*Attesting Officer*

JAMES E. ROGAN
*Director of the United States Patent and Trademark Office*